(12) United States Patent
Cirkel et al.

(10) Patent No.: US 7,382,141 B2
(45) Date of Patent: Jun. 3, 2008

(54) TESTING A BATCH OF ELECTRICAL COMPONENTS

(75) Inventors: Cornelis Oene Cirkel, Nijmegen (NL); Jaruwan Sithisaksawat, Bangkok (TH)

(73) Assignee: NXP B.V., Eindhoven (NL)

( * ) Notice: Subject to any disclaimer, the term of this patent is extended or adjusted under 35 U.S.C. 154(b) by 401 days.

(21) Appl. No.: 10/185,928

(22) Filed: Jun. 28, 2002

(65) Prior Publication Data
US 2003/0062913 A1    Apr. 3, 2003

(30) Foreign Application Priority Data
Jul. 3, 2001    (EP)    ................................. 01202544

(51) Int. Cl.
*G01R 31/26* (2006.01)
(52) U.S. Cl. ..................... 324/754; 324/765; 324/73.1
(58) Field of Classification Search ............... 324/73.1, 324/754, 759–760, 764–765, 158.1; 714/710–711, 714/718, 721
See application file for complete search history.

(56) References Cited

U.S. PATENT DOCUMENTS

| | | | |
|---|---|---|---|
| 5,327,437 A | 7/1994 | Balzer | ........................ 714/736 |
| 5,589,765 A | 12/1996 | Ohmart et al. | ........... 324/158.1 |
| 5,764,650 A | 6/1998 | Debenham | ................... 714/704 |
| 5,862,088 A * | 1/1999 | Takemoto et al. | .......... 365/201 |
| 5,867,505 A * | 2/1999 | Beffa | .......................... 714/718 |
| 6,195,772 B1 * | 2/2001 | Mielke et al. | ............... 714/724 |
| 6,499,118 B1 * | 12/2002 | Michaelson | ................. 714/711 |
| 6,731,127 B2 * | 5/2004 | Watts | ......................... 324/765 |

OTHER PUBLICATIONS

Abstract of JP01169938.

* cited by examiner

*Primary Examiner*—Minh N Tang
(74) *Attorney, Agent, or Firm*—Peter Zawilski

(57) ABSTRACT

The invention relates a method for testing a batch of electrical components like Integrated Circuits, the method involving applying a first test (6) on each electrical component from the batch; and applying a second test (12) on electrical components that have failed the first test (6). Advantageously, the second test (12) is applied directly after the first test (6). Preferably, the first test (6) includes a functional test, and the second test (12) includes a Contact-and-Short-Circuit test.

16 Claims, 1 Drawing Sheet

TESTING A BATCH OF ELECTRICAL COMPONENTS

Figure 1:
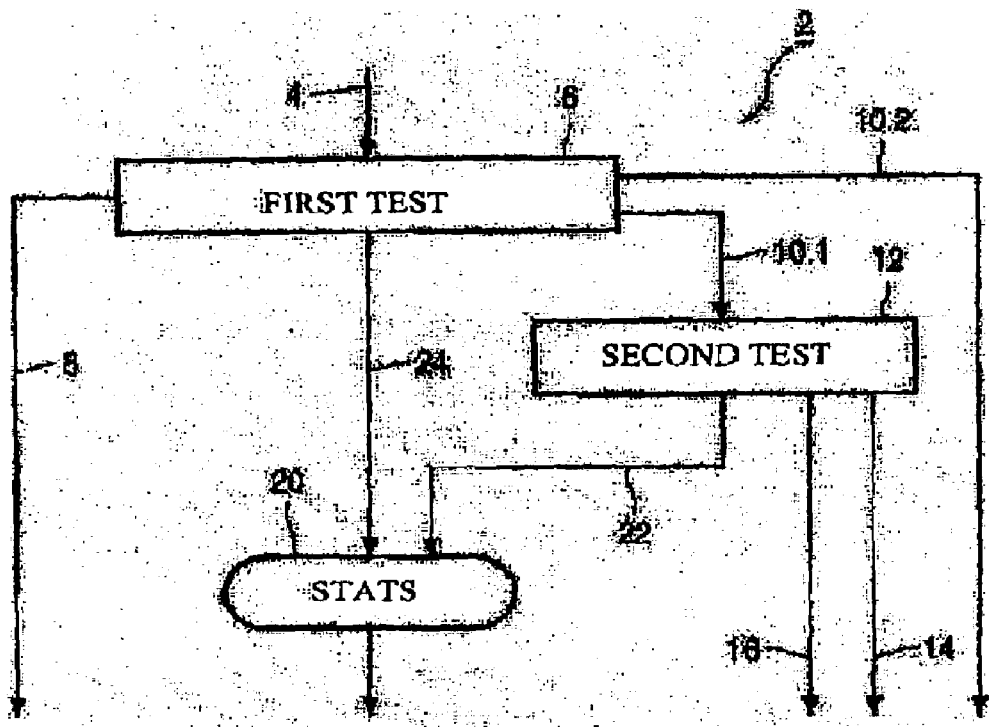

The invention relates to a method of testing a batch of electrical components like Integrated Circuits, to a method of manufacturing an electrical component, and to a test apparatus.

Testing a batch of electrical components and manufacturing electrical components such as but not limited to Integrated Circuits are known in actual practice. In a known method a Contact-and-Short-Circuit test (short: C&S-test) is applied on each electrical component from the batch. In the C&S-test the electrical contacts of the components are tested. The components that have passed the C&S-test are subsequently tested in a functional test wherein the operational characteristics of the components are tested. In such a functional test one or more parameters of the electrical components are measured and compared with predetermined parameter-ranges. In this context the comprehension of the word "parameter" is broad: the functional test can comprise parametric tests, Go-NoGo-tests, digital tests or a combination thereof. In the latter case the functional test comprises a number of sub-tests. The approach of the known method is based on the strategy of rejecting faulty components as quickly as possible.

A disadvantage of the method of the first kind is that this method takes a lot of time. This is caused by the fact that all components are at least tested in two tests. The first test being the C&S-test and the second test being the functional test.

It is an object of the invention to meet said disadvantage. The invention is defined by the independent claims; the dependent claims define advantageous embodiments.

A primary aspect of the invention provides a method for testing a batch of electrical components like Integrated Circuits, the method comprising: applying a first test on each electrical component from the batch; and applying a second test on electrical components that have failed the first test. Advantageously, the second test is applied directly after the first test. Preferably, the first test comprises a functional test, and the second test comprises a Contact-and-Short-Circuit test.

On aspect of the invention is based on the recognition that if a component passes the functional test it normally will pass the C&S-test. Thus, for passed components, the C&S-test does not offer additional information to the functional test. Therefore, the known test method will, especially for batches with high yields wherein good components are unnecessarily tested two times, take long test-times. This eventually results in a lower production quantities and thus in higher prices of electrical components.

According to a first aspect of the invention, a functional test is applied on each electrical component from the batch and that the Contact-and-Short-Circuit test is only applied on electrical components that failed the functional test. This ensures that the C&S-test is only applied at components which failed the functional test and therefore the total test-time is reduced.

In the functional test operational characteristics of the component are tested. Normally the functional test is designed in such a way that the component will fail the functional test if only one hardware connection is defect. Therefore the functional test implicitly comprises a C&S-test. However, if a component has failed the functional test, the cause of this failure can be found with one or more dedicated C&S-test(s) afterwards. In this way a defect connection of the component can be located.

In an embodiment of the invention the method also comprises the steps of: using test-results of the Contact-and-Short-Circuit test for drawing up a more detailed diagnosis of assessed failures of electrical components which are tested in the Contact-and-Short-Circuit test; and updating statistical files on the basis of said diagnosis. In this embodiment the test results of the C&S-test are used to calculate statistical data of the electrical components in the batch. The statistical data generally will be reliable since it is based on components that have been submitted to two successive tests. The data can for example comprise information about the quality of the components.

In an elaborated embodiment of the invention the functional test comprises testing the operation of an electrical component by measuring at least one parameter of the electrical component and comparing the at least one measured parameter with at least one predetermined parameter-range for said at least one parameter, wherein the electrical component fails the functional test if at least one measured parameter does not lie in its corresponding parameter-range. In an even further elaborated embodiment according to the invention, the C&S test is not applied to electrical components for which at least one measured parameter of a predetermined type lies outside its corresponding parameter-range. In this way an a priori selection of parameters for each batch can be made wherein for each parameter is determined if a measurement of this parameter lying outside its corresponding parameter-range will yield a C&S test. This possibility is of importance in the following situation. Suppose that for a particular batch of components it is a priori known that a certain parameter has a deviation from an expected probability distribution. This may for example be caused by a wrong adjustment of a production machine for manufacturing the components. In this case a lot of components may fail the functional test and consequently a lot of components would normally subsequently be tested in the C&S-test. This is undesirable since the total amount of test time would increase significantly whilst it is known that most components rightly have failed the functional test. Therefore, in this case, the parameter with the deviated probability distribution should a priori be classified as a parameter of the predetermined type, so that components which fail the functional test on the basis of this parameter are rejected immediately.

The first and second tests can be C&S-tests, functional tests, combinations thereof or other tests. An advantage of automatically re-testing over manually re-testing is that it costs much less time. Manually re-testing causes stagnation in the production process and is therefore expensive. Furthermore, automatically re-testing can be applied by the same test-apparatus. This leads a more reliable over all test since errors and/or instabilities (i.e. frequently occurrence of differences between first and second test) in the test-apparatus can be detected quickly.

A preferred embodiment of the invention uses a test-apparatus which, in the first test, establishes first mechanical contacts with a component from the batch for performing the first test on the component and thereafter brakes said first mechanical contacts, while in the second test the test-apparatus establishes second mechanical contacts with the component for performing the second test on the component and thereafter breaks said second mechanical contacts, wherein the first mechanical contacts are essentially identical with the second mechanical contacts. Said mechanical contacts are used for making electrical connections between the test-apparatus and the electrical components. In some situations there can be a thin layer of metal-oxide on the mechanical contacts of an electrical component. Such a layer may (wholly or partial) block electrical contacts, resulting in that the corresponding component fails the test while in principle the electrical component is all right. Applying the first mechanical contacts can result in that the layer of metal-oxide will be scraped away by the contact-pins for establishing the mechanical contacts of the test apparatus. Consequently the component may pass the second test wherein the electrical contacts can be established. Thus, according to this embodiment the chance that electrical components unnecessarily fail the tests is minimized.

In an embodiment of the invention the method also comprises the steps of: using test-results of the tests for drawing up a diagnosis of assessed failures of the tested electrical components; and updating statistical files on the basis of said diagnosis. In this embodiment test results are used to calculate statistical data of the electrical components in the batch. These data may, for example indicate that a certain batch has a low quality level or that certain test equipment has a malfunction. The latter offers the opportunity to trace defect test-apparatus by comparing test-data from the first test with test-data from the second test. In a more specific situation, wherein the test-apparatus uses contact-pins for establishing the said mechanical contacts, it will be possible to detect defect hardware pin-contacts in an early stage.

A further embodiment of the invention is wherein the first test comprises a functional test wherein the operation of the electrical components is tested according to predetermined characteristics and that the second test comprises a functional test and a Contact-and-Short-Circuit test. Preferably, the test results of the Contact-and-Short-Circuit test are used for drawing up a diagnosis of assessed failures of electrical components from the second category. Furthermore, the electrical components from the first category can be tested at random according to a third test for checking the operation of the test-apparatus. It can be checked if the test results of the third test correspond to the first and second test. This offers the opportunity to check the proper operation of the test-apparatus.

These and other aspects of the invention will be illustrated by means of the embodiments described below.

Figure 2:
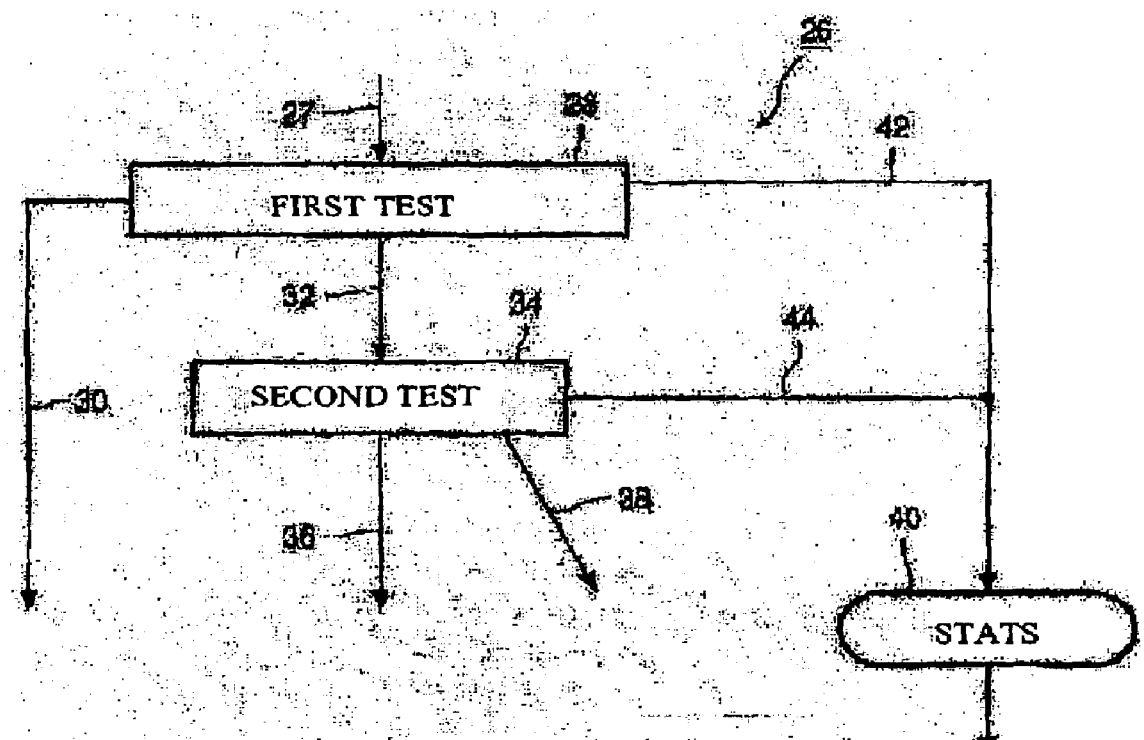

In the accompanying drawings, in which certain modes for carrying out the present invention are shown for illustrative purposes:

FIG. 1 is a schematic flow-diagram showing a first embodiment of a method for testing electrical components according to the invention; and FIG. 2 is a schematic flow diagram showing a second embodiment of a method for testing electrical components according to the invention;

FIG. 1 illustrates a method for testing a batch of electrical components like Integrated Circuits by means of a flow diagram 2. The arrow 4 represents an input stream of electrical components, each component will be subject of the functional test 6. This functional test 6 is applied by a dedicated test-apparatus, which is not shown in FIG. 1. During the functional test at least some of the operational characteristics of the components are determined by the test-apparatus. Preferably the functional test is designed in such a way that at least the most important hardware connections are used in the functional test, so that the component fails the functional test if one of these connections is defect.

The components that have passed the functional test form a first category, while the components that have failed the functional test form a second category. The stream of components in the first category is represented with the arrow 8, and the stream of components in the second category is represented with the arrows 10.1 and 10.2. The reason for dividing the stream of components in the second category into two sub-streams 10.1 and 10.2 will be explained hereinafter.

The components in the sub-stream 10.1 (part of the second category) are subsequently submitted to a so-called Contact-and-Short-Circuit test 12 (short: C&S test). In the C&S test 12 hardware connections and/or the missing of hardware connections is/are tested. Therefore the C&S test 12 is suitable for determining the cause of the failure(s) of the corresponding component in the functional test 6. Next, the components that have been submitted to the C&S test 12 are divided into two categories. The electrical components that have passed the C&S test 12 form a third category 14, while the electrical components that have failed the C&S test 12 form a fourth category 16.

At this point there are four mainstreams of electrical components:

The first mainstream of components indicated with arrow 8 comprises electrical components that have passed the functional test 6. These components are approved and can be used for further applications. It is an option to use electrical components from mainstream 8 at random for Quality Assurance (QA) or Quality Assurance on the fly (QAOTF) tests. Herewith, some components from the first mainstream are tested again according to the functional and/or C&S-test for checking if the same test-results are obtained.

The second mainstream 14 comprises electrical components that have failed the functional test 6 but have passed the C&S test 12. Optionally, electrical components from the second mainstream 14 can be re-tested according to the functional test 6 and the C&S test 12.

The third mainstream 16 comprises electrical components which have failed the functional test 6 and which have also have failed the C&S test 12. Optionally, electrical components from the third mainstream 16 can be re-tested according to the functional test 6 and the C&S test 12.

The fourth mainstream 10.2 (which will be discussed hereinafter in more detail) comprises electrical components from a batch which has some statistically deviating properties (i.e. batch of components with a priori known statistical manufacturing faults).

In the functional test 6 of the example of FIG. 1, the operation of an electrical component is tested by measuring at least one parameter of the electrical component. The at least one measured parameter is compared with at least one predetermined parameter-range for said at least one parameter wherein the electrical component fails the functional test if the at least one measured parameter does not lie in its corresponding parameter-range. Thereby it is possible that the at least one parameter represents a physical characteristic of the electrical component like a resistance value or an electrical capacity. The at least one parameter can also relate to a functional characteristic of the component like a specific gain profile, an output voltage which is a function of an input voltage or digital input-output relations or a Go-NoGo-test.

According to the test method of FIG. 1 said at least one parameter is, prior to the application of the functional test 6, classified either as a parameter of a first type or as a parameter of a second type. The C&S test 12 is only applied to those electrical components from the second category for which the parameter(s) of the second type lie(s) in its corresponding parameter-range(s). These components from the second category form the sub-stream 10.1. However, the C&S test 12 is not applied to electrical components from the second category for which at least one measured parameter of the second type lies outside its corresponding parameter-range. These components from the second category form the substream 10.2. The components in the sub-stream 10.2 are directly rejected or thrown away. The reason for the distinction of components in the sub-streams 10.1 and 10.2 will be explained hereinafter.

Suppose that for a particular batch of components it is a priori known that a certain parameter has a deviation from an expected probability distribution. This may for example be caused by a wrong adjustment of a manufacturing apparatus. In this case a lot of components may fail the functional test 6 and consequently a lot of components would normally subsequently be tested in the C&S-test 12. This is undesirable since the total amount of test time would increase significantly whilst it is known that most components rightly have failed the functional test 6. Therefore, in this case, the parameter with the deviated probability distribution should a priori be classified as a parameter of the second type, so that components which fail the functional test on the basis of this parameter are immediately rejected via the sub-stream 10.2.

The test equipment for performing the method for testing components according to FIG. 1 may be provided with a diagnosis unit 20 (schematically indicated in FIG. 1) for drawing up a more detailed diagnosis of assessed failures of the electrical components. For drawing up said diagnosis the unit 20 make amongst others use of the test-results of the C&S test 12. The data comprising information relating to these test-results is sent by the test-apparatus, which performs the C&S test 12, via the data line 22 to the diagnosis unit 20. The data supplied via the connection 22 can for example comprise the flow rate of electrical components with a certain defect. Preferably the unit 20 is also connected via a data connection 24 to the test-apparatus. The data supplied via connection 24 can for example comprise the total flow rate of electrical components. On the basis of these data the unit 20 can calculate statistical data and update statistical files. Furthermore the unit 20 can make a diagnosis on the basis of these data, for example that a certain batch has a low quality level or that certain test equipment has a malfunction.

FIG. 2 is a diagram showing a flow diagram 26 of a method for testing a batch of electrical components, like Integrated Circuits, with a test-apparatus. In FIG. 2 a stream of electrical components of a batch which has to be tested is schematically indicated with 27. The method for testing the electrical components of the stream 27 comprises a first test 28 applied by the test-apparatus on each electrical component from the batch. The components that have passed the first test form a first category 30, and the components that have failed the first test form a second category 32. The components in the first category 30 are approved and can be used for further applications.

The electrical components in the second category 32 are automatically re-tested with the test-apparatus according to a second test (re-test) 34, wherein the second test is applied directly after the first test 28. The electrical components that have passed the second test 34 form a third category 36, and the electrical components that have failed the second test form a fourth category 38.

In this example the test-apparatus in the first test 28 establishes first mechanical contacts for performing the first test and thereafter brakes said first mechanical contacts. Next, the test-apparatus in the second test 34 establishes second mechanical contacts for performing the second test and thereafter breaks said second mechanical contacts, wherein the first mechanical contacts are essentially identical with the second mechanical contacts. The effect of this way of re-testing is that thin insulating layers of metal-oxide which may exist on one or more contact points of the component are scraped away during the first test 28 such that the component may be able to establish electrical contact with the test-apparatus in the second test and thus to pass the second test (re-test) 34.

The streams 36 and 38 may be tested according to a third test for checking the proper operation of the tests 28 and 34.

The test equipment for performing the method for testing components according to FIG. 2 may be provided with a diagnosis unit 40 (schematically indicated in FIG. 2) for drawing up a more detailed diagnosis of assessed failures of the electrical components. For drawing up said diagnosis the unit 40 makes amongst others use of the test-results of the first test 28. The data comprising information relating to these test-results is sent by the test-apparatus, which performs the first test 28, via the data line 42 to the unit 40. The data supplied via the connection 42 can for example comprise the flow rate of electrical components with a certain defect. Preferably the unit 40 is also connected via a data connection 44 to the test-apparatus 34 for performing the second test. The data supplied via connection 44 can for example comprise the total flow rate of electrical components. On the basis of these data the unit 40 can calculate statistical data and update statistical files. Furthermore the unit 40 can make a diagnosis on the basis of these data, for example that a certain batch has a low quality level or that certain test equipment has a malfunction. The data statistical data can be used for tracing defect test-apparatus by comparing test-data (supplied via connection 42) from test-apparatus 28 with test-data (supplied via connection 44) from test-apparatus 34. In this way it will for example be possible to detect defect hardware pin-contacts (the latter used for establishing the said mechanical contacts) of the test-apparatus in an early stage.

In a more elaborated embodiment of this example the first test 28 comprises a functional test wherein the operation of the electrical components is tested according to predetermined characteristics, and the second test 34 comprises a functional test and a Contact-and-Short-Circuit test. The test results of the Contact-and-Short-Circuit test may be used for drawing up a diagnosis of assessed failures and for updating statistical files with respect to data of the electrical components from the second category 32.

Optionally, the electrical components from the first category 30 can be tested at random according to a third test in order to establish a Quality Assurance (QA or QAOTF) test.

The invention has been described by means of a few embodiments. However, it should be noted that the invention can be practiced otherwise than as specifically illustrated and described without departing from its scope. The invention is not limited to testing integrated circuits, as it may be applied to testing components such as tuner modules or power modules. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements, and by means of a suitably programmed computer. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of testing a batch of integrated circuits, the method comprising:
   applying a first test on each integrated circuit from the batch; and
   applying a second test on unmodified integrated circuits that have failed the first test, the second test not being applied on integrated circuits that pass the first test, wherein the first test is a functional test, and the second test is a Contact-and-Short-circuit test.

2. A method according to claim 1, wherein the first test comprises measuring at least one parameter of the integrated circuits and comparing the at least one measured parameter with a corresponding first predetermined parameter-range for said at least one parameter, wherein an integrated circuit fails the first test if the at least one measured parameter of the integrated circuit does not lie in the corresponding first predetermined parameter-range.

3. A method according to claim 2, wherein the second test is not applied to integrated circuits that fail the first test for which the at least one measured parameter of the integrated circuit lies outside a corresponding second predetermined parameter-range.

4. A method according to claim 1, wherein the method is carried out by means of a test apparatus that establishes first mechanical contacts with an integrated circuit from the batch for performing the first test on the integrated circuit and thereafter breaks said first mechanical contacts, and wherein in the second test the test apparatus establishes second mechanical contacts with the integrated circuit for performing the second test on the integrated circuit and thereafter breaks said second mechanical contacts, wherein the first mechanical contacts are essentially identical with the second mechanical contacts.

5. A method of manufacturing integrated circuits, the method comprising:
   supplying the logic integrated circuits;
   applying a first test on the integrated circuits; and
   applying a second test on unmodified integrated circuits that have failed the first test, the second test not being applied on integrated circuits that pass the first test, wherein the first test is a functional test, and the second test is a Contact-and-Short-Circuit test, and wherein the method is carried out by a test apparatus that establishes first mechanical contacts with an integrated circuit from the batch to perform the first test on the integrated circuit and thereafter breaks said first mechanical contacts, and the test apparatus establishes second mechanical contacts with the integrated circuit to perform the second test on the integrated circuit and thereafter breaks said second mechanical contacts, the first mechanical contacts being essentially identical with the second mechanical contacts.

6. Test apparatus for testing a batch of integrated circuits, the test apparatus comprising:
   means for applying a first test on each integrated circuit from the batch; and
   means for applying a second test on unmodified integrated circuits that have failed the first test, the second test not being applied on integrated circuits that pass the first test, wherein the first test is a functional test, and the second test is a Contact-and-Short-Circuit test.

7. A method according to claim 1, further comprising reapplying the first test on integrated circuits that pass the second test.

8. A method according to claim 1, further comprising calculating statistical data for the batch of integrated circuits based upon results of the first and second tests.

9. A method according to claim 5, wherein the first test comprises measuring at least one parameter of each integrated circuit and comparing the at least one measured parameter of each integrated circuit with a corresponding first predetermined parameter-range, wherein an integrated circuit fails the first test if the at least one measured parameter of the integrated circuit does not lie in the corresponding first predetermined parameter-range.

10. A method according to claim 9, wherein the second test is not applied to integrated circuits that fail the first test for which the at least one measured parameter of the integrated circuit lies outside a corresponding second predetermined parameter-range.

11. A method according to claim 5, further comprising reapplying the first test on integrated circuits that pass the second test.

12. A method according to claim 5, further comprising calculating statistical data for the integrated circuits based upon results of the first and second tests.

13. An apparatus according to claim 6, wherein the first test comprises measuring at least one parameter of each integrated circuit and comparing the at least one measured parameter of each integrated circuit with a corresponding first predetermined parameter-range, wherein an integrated circuit fails the first test if the at least one measured parameter of the integrated circuit does not lie in the corresponding first predetermined parameter-range.

14. An apparatus according to claim 13, wherein the second test is not applied to integrated circuits that fail the first test for which the at least one measured parameter of the integrated circuit lies outside a corresponding second predetermined parameter-range.

15. An apparatus according to claim 6, wherein the test apparatus establishes first mechanical contacts with an integrated circuit from the batch to perform the first test on the integrated circuit and thereafter breaks said first mechanical contacts, and wherein the test apparatus establishes second mechanical contacts with the integrated circuit to perform the second test on the integrated circuit and thereafter breaks said second mechanical contacts, the first mechanical contacts being essentially identical with the second mechanical contacts.

16. An apparatus according to claim 6, wherein the first test is reapplied on integrated circuits that pass the second test.

* * * * *